United States Patent [19]

Miyazaki et al.

[11] Patent Number: 5,602,620
[45] Date of Patent: Feb. 11, 1997

[54] SCANNING EXPOSURE APPARATUS AND EXPOSURE METHOD

[75] Inventors: Seiji Miyazaki; Kei Nara, both of Yokohama; Masami Seki, Shiki; Masamitsu Yanagihara, Yokohama, all of Japan

[73] Assignee: Nikon Corporation, Japan

[21] Appl. No.: 490,212

[22] Filed: Jun. 14, 1995

[30] Foreign Application Priority Data

Jun. 16, 1994 [JP] Japan .................................. 6-158126

[51] Int. Cl.⁶ ........................... G03B 27/42; G01B 11/00
[52] U.S. Cl. ................................. 355/53; 355/54; 355/60; 356/400; 356/401
[58] Field of Search .................................. 355/43, 60, 53, 355/55, 50; 356/400, 401; 250/548

[56] References Cited

U.S. PATENT DOCUMENTS

| 5,440,397 | 8/1995 | Ono et al. | 356/401 |
| 5,506,684 | 4/1996 | Ota et al. | 356/401 |
| 5,528,027 | 6/1996 | Mizutani | 250/234 |

Primary Examiner—Arthur T. Grimley
Assistant Examiner—Herbert V. Kerner
Attorney, Agent, or Firm—Pennie & Edmonds

[57] ABSTRACT

The present invention is directed to scanning exposure apparatus and exposure method to achieve simultaneous projection of images of plural regions on a mask onto a photosensitive substrate with correcting an orthogonality error of a pattern on the mask or photosensitive substrate. If the pattern on the mask or photosensitive substrate has an orthogonality error causing a deviation of a certain angle in a first direction perpendicular to a scanning direction as it goes in the scanning direction, the mask and the photosensitive substrate are rotated relative to each other in the plane thereof to align one coordinate axis in a coordinate system of each pattern with the first direction. Then a relative displacement is given by an amount of the orthogonality error between positions of images projected through a first optical system and positions of images projected through a second optical system, and relative positions of the mask and the photosensitive substrate are continuously changed by the amount of the orthogonality error in the first direction in accordance with the position of the mask or photosensitive substrate in the scanning direction.

14 Claims, 6 Drawing Sheets

SCANNING EXPOSURE APPARATUS AND EXPOSURE METHOD

BACKGROUND OF THE INVENTION

1. Field of the Invention

The present invention relates to a scanning exposure apparatus and an exposure method, for example suitably applicable to exposure of large-area patterns on a photosensitive substrate used for fabricating liquid crystal display devices.

2. Related Background Art

Conventional exposure apparatus for exposure of large-area patterns of this kind include those of scanning types such as the step-and-repeat type for repetitively projecting small transfer images of mask through a single projection optical system onto the photosensitive substrate or the mirror projection type for projecting transfer images at magnification of unity to mask as obtained by an arc slit illumination beam through a single projection optical system onto the photosensitive substrate.

On the other hand, it is considered that a plurality of projection optical systems are arranged instead of the single projection optical system. Namely, exposure apparatus of this type are so arranged that light beams emitted from a plurality of illumination optical systems illuminate a plurality of small regions on the mask. Transfer images of these plural small regions are simultaneously projected through respective projection optical systems onto the photosensitive substrate.

As shown in FIG. 6, the transfer images P1–P5 of plural small regions are transferred as separated into a first series of transfer images including the transfer images P1, P3, and P5 and a second series of transfer images including the transfer images P2 and P4. The direction of the first series of transfer images is approximately perpendicular to the scanning direction (hereinafter referred to as the X direction) of the mask and photosensitive substrate and parallel to the Y direction within the plane of photosensitive substrate. The transfer images P1, P3, and P5 are arranged with separations 2Ly between the centers thereof. Also, the direction of the second series of transfer images is parallel to that of the first series of transfer images, and the transfer images P2 and P4 are arranged with a separation 2Ly between the centers thereof. Then, these transfer images P1–P5 are transferred by scanning in the X direction while partly overlapping in the Y direction. By this, large-area patterns are projected onto the photosensitive substrate when the mask and the photosensitive substrate are synchronously scanned.

SUMMARY OF THE INVENTION

The present invention concerns a scanning exposure apparatus which comprises a plurality of illumination optical systems each for illuminating a plurality of regions M1–M5 on a mask with a pattern formed thereon, a first optical system having a plurality of projection optical systems optical axes of which are arranged in a line along a first direction Y, and a second optical system having a plurality of projection optical systems which are arranged in parallel with the first optical system and optical axes of which are arranged in a line a predetermined distance D apart from that of the first optical system, in which some P1, P3, P5 of images P1–P5 of the plurality of regions M1–M5 and the rest P2, P4 of the images P1–P5 are simultaneously projected through the first optical system and through the second optical system, respectively, onto the photosensitive substrate, in which the mask and the photosensitive substrate are synchronously scanned in a direction X approximately perpendicular to the first direction Y and in the plane of photosensitive substrate, and which is further provided with rotating means for effecting relative rotation between the mask and the photosensitive substrate in the plane of mask or photosensitive substrate, position changing means for changing relative positions of the mask and the photosensitive substrate in the first direction Y in accordance with a position in the scanning direction X, of the mask or photosensitive substrate, and image position changing means for relatively changing positions of the images P1, P3, P5 projected through the first optical system and positions of the images P2, P4 projected through the second optical system in the first direction Y.

It is preferred that the image position changing means be arranged to effect the relative change, based on a deviation of angle of a first coordinate system concerning an arrangement of the pattern formed on the mask with respect to a second coordinate system determined by the scanning direction X and the direction Y perpendicular to the scanning direction X.

In the case where on the photosensitive substrate, first images of the pattern of mask are preliminarily formed and second images of the pattern of mask are then to be projected for exposure as overlapping with the first images, positions of the second images are relatively changed based on a deviation of angle of a first coordinate system concerning an arrangement of the first images with respect to a second coordinate system determined by the scanning direction X and the direction Y perpendicular to the scanning direction.

In the case where on the photosensitive substrate, first images of the pattern of mask are preliminarily formed and second images of the pattern of mask are then to be projected for exposure as overlapping with the first images, positions of the second images are relatively changed based on a deviation of angle of a first coordinate system concerning an arrangement of the pattern of mask with respect to a second coordinate system concerning an arrangement of the first images.

Also, the present invention relates to a scanning exposure apparatus which comprises a plurality of illumination optical systems each for illuminating a plurality of regions M1–M5 on a mask with a pattern formed thereon, a first optical system having a plurality of projection optical systems optical axes of which are arranged in a line along a first direction Y, and a second optical system having a plurality of projection optical systems which are arranged in parallel with the first optical system and optical axes of which are arranged in a line a predetermined distance apart from that of the first optical system, in which some P1, P3, P5 of images P1–P5 of the plurality of regions M1–M5 and the rest P2, P4 of the images P1–P5 of the plurality of regions M1–M5 are projected through the first optical system and through the second optical system, respectively, onto the photosensitive substrate, and in which the mask and the photosensitive substrate are synchronously scanned in a direction X approximately perpendicular to the first direction Y and in the plane of photosensitive substrate. The apparatus is provided with image position changing means 9A–9E for changing, by a predetermined angle, arrangement directions of the images P1–P5 projected through the first optical system and the second optical system relative to the first direction Y, changing intervals 2Ly between the images P1, P3, P5 projected through the first optical system and an interval 2Ly between the images P2, P4 projected through the second optical system, and changing positions of the respective images P1–P5 in a rotational direction with respect to the optical axis.

In the case where on the photosensitive substrate, first images of the pattern of mask are preliminarily formed and second images of the pattern of mask are then to be projected for exposure as overlapping with the first images, the image position changing means performs the changing of arrangement directions, the changing of image intervals, and the changing of positions in the rotational direction, based on a deviation of angle of a first coordinate system concerning an arrangement of the first images with respect to a second coordinate system determined by the scanning direction X and the direction Y perpendicular to the scanning direction X.

In the case where on the photosensitive substrate, first images of the pattern of mask are preliminarily formed and second images of the pattern of mask are then to be projected for exposure as overlapping with the first images, the image position changing means performs the changing of arrangement directions, the changing of image intervals, and the changing of positions in the rotational direction, based on a deviation of angle of a first coordinate system concerning an arrangement of the pattern with respect to a second coordinate system concerning an arrangement of the first images.

An exposure method according to the present invention is carried out by an apparatus comprising a plurality of illumination optical systems each for illuminating a plurality of regions M1–M5 on a mask with a pattern formed thereon, a first optical system having a plurality of projection optical systems optical axes of which are arranged in a line along a first direction Y, and a second optical system having a plurality of projection optical systems which are arranged in parallel with the first optical system and optical axes of which are arranged in a line a predetermined distance apart from that of the first optical system, in which some P1, P3, P5 of images P1–P5 of the plural regions M1–M5 and the rest P2, P4 of the images P1–P5 of the plural regions M1–M5 are projected through the first optical system and through the second optical system, respectively, onto the photosensitive substrate and in which the mask and the photosensitive substrate are synchronously scanned in a direction X approximately perpendicular to the first direction Y and in the plane of photosensitive substrate, said exposure method comprising a rotating process for relatively rotating the mask and the photosensitive substrate within the plane of mask or photosensitive substrate, a position changing process for changing relative positions of the mask 1 and the photosensitive substrate 8 in the first direction Y in accordance with a position of the mask or photosensitive substrate in the scanning direction X, and an image position changing process for relatively changing positions of the images P1, P3, P5 projected through the first optical system and positions of the images P2, P4 projected through the second optical system in the first direction Y.

It is preferred that the image position changing process be arranged to effect the relative change, based on a deviation of angle of a first optical system concerning an arrangement of the pattern formed on the mask with respect to a second coordinate system determined by the scanning direction X and the direction Y perpendicular to the scanning direction X.

In the case where on the photosensitive substrate, first images of the pattern of mask are preliminarily formed and second images of the pattern of mask are then to be projected for exposure as overlapping with the first images, the image position changing process is to effect the relative change, based on a deviation of angle of a first coordinate system concerning an arrangement of the first images with respect to a second coordinate system determined by the scanning direction X and the direction Y perpendicular to the scanning direction X.

In the case where on the photosensitive substrate, first images of the pattern of mask are preliminarily formed and second images of the pattern of mask are then to be projected for exposure as overlapping with the first images, the image position changing process is to effect the relative displacement, based on a deviation of angle of a first coordinate system concerning an arrangement of the pattern of mask with respect to a second coordinate system concerning an arrangement of the first images.

An exposure method according to the present invention is carried out by an apparatus comprising a plurality of illumination optical systems each for illuminating a plurality of regions M1–M5 on a mask with a pattern formed thereon, a first optical system having a plurality of projection optical systems optical axes of which are arranged in a line along a first direction Y, and a second optical system having a plurality of projection optical systems which are arranged in parallel with the first optical system and optical axes of which are arranged in a line a predetermined distance apart from that of the first optical system, in which some P1, P3, P5 of images P1–P5 of the plural regions M1–M5 and the rest P2, P4 of the images P1–P5 of the plural regions M1–M5 are projected through the first optical system and through the second optical system, respectively, onto the photosensitive substrate and in which the mask and the photosensitive substrate are synchronously scanned in a direction X approximately perpendicular to the first direction Y and in the plane of photosensitive substrate, said exposure method comprising an image position changing process for changing, by a predetermined angle, arrangement directions of the images projected through the first optical system and the second optical system relative to the first direction, changing intervals between the images P1, P3, P5 projected through the first optical system and an interval between the images P2, P4 projected through the second optical system, and changing positions of the respective images P1–P5 in a rotational direction with respect to the optical axis.

In the case where on the photosensitive substrate, first images of the pattern of mask are preliminarily formed and second images of the pattern of mask are then to be projected for exposure as overlapping with the first images, the image position changing process is to effect the changing of arrangement directions, the changing of image intervals, and the changing of positions in the rotational direction, based on a deviation of angle of a first coordinate system concerning an arrangement of the first images with respect to a second coordinate system determined by the scanning direction X and the direction Y perpendicular to the scanning direction X.

In the case where on the photosensitive substrate, first images of the pattern of mask are preliminarily formed and second images of the pattern of mask are then to be projected for exposure as overlapping with the first images, the image position changing process is to effect the changing of arrangement directions, the changing of image intervals, and the changing of positions in the rotational direction, based on a deviation of angle of a first coordinate system concerning an arrangement of the pattern of mask with respect to a second coordinate system concerning an arrangement of the first images.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DETAILED DESCRIPTION OF THE PREFERRED EMBODIMENTS

Figure 7:
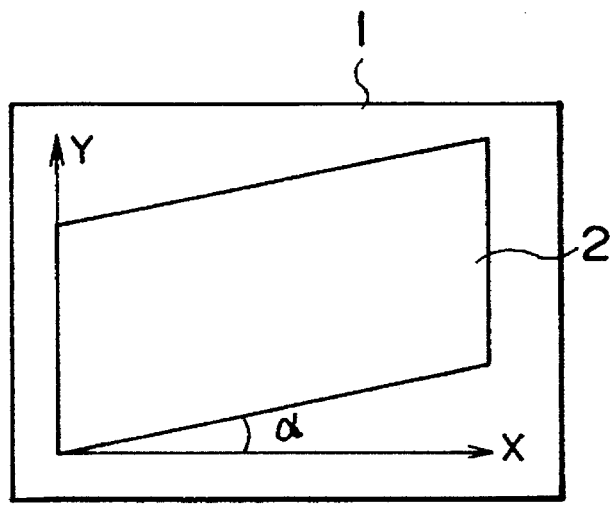
FIG. 7 is a drawing to show a case in which the edges along the X direction of the already written pattern in the photosensitive substrate have a deviation of angle.
Figure 8:
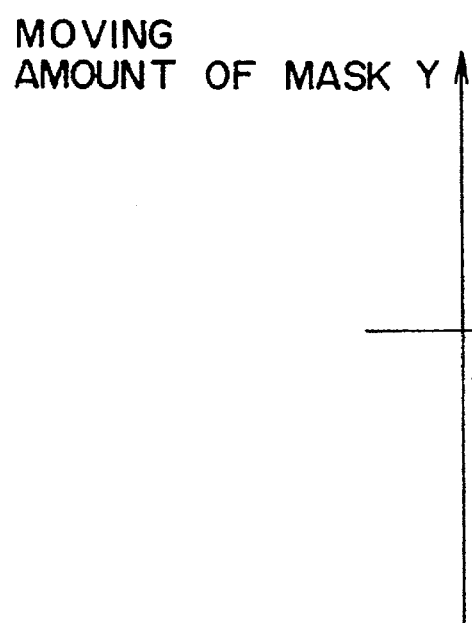
FIG. 8 is a graph to show the moving amount of the mask by drive motors.

Let us here consider a case where a mask pattern 2 formed on a mask 1 has an orthogonality error $\alpha$ that an edge along the X direction deviates by an angle $\alpha$ in the +Y direction as it goes in the +X direction, as shown in FIG. 7. In this case, if the mask is continuously displaced in the Y direction as shown in FIG. 8 as the mask and the photosensitive substrate synchronously move in the X direction, the mask pattern 2 is projected onto the photosensitive substrate with the first and second series of transfer images from the beginning to the end of scanning, whereby normal transfer images can be projected onto the photosensitive substrate, eliminating the orthogonality error $\alpha$.

However, the first and second series of transfer images are projected by a plurality of projection optical systems the optical axes of which are arranged in two lines separated at a predetermined distance D from each other. Thus, there exists the same distance D between the center of the first transfer image series and the center of the second transfer image series as that for the projection optical systems. This means that a combinational pattern of the transfer images P1–P5 projected onto the photosensitive substrate cannot accurately reproduce the mask pattern 2 even though the mask is continuously displaced in the Y direction as the mask and the photosensitive substrate synchronously move in the X direction.

Figure 6:
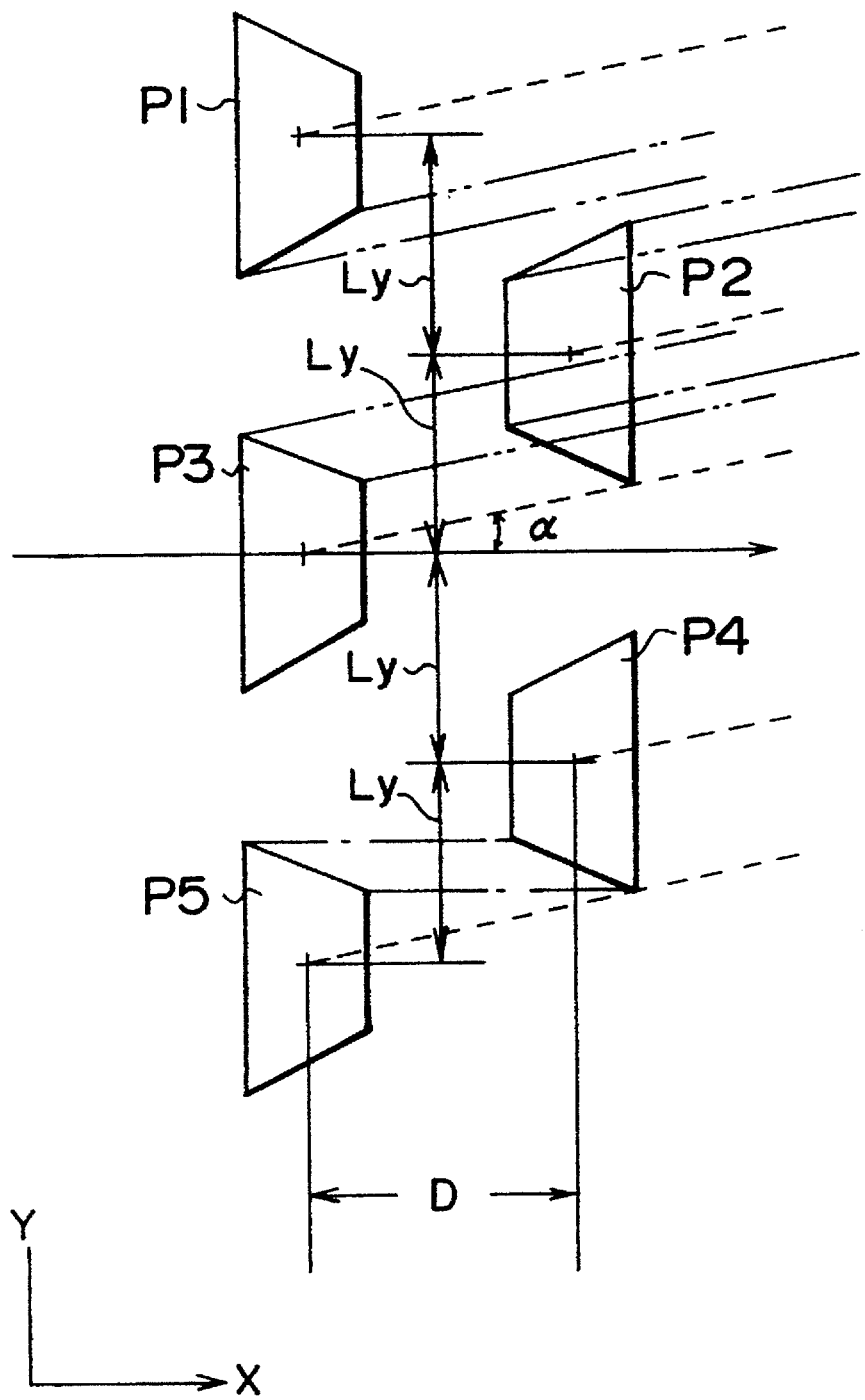

In more detail, because of the distance D between the series, the Y-directional movement during scan changes the center distance (a distance between loci of the centers), for example, between transfer images P1 and P2 from Ly to (Ly±Dtan$\alpha$), as shown in FIG. 6. When compared with the mask pattern 2, the combinational pattern of transfer images P1–P5 after exposure on the photosensitive substrate includes portions exposed in an excessive junction state in the Y direction (for example, P2 and P3) and portions exposed in an insufficient junction state (for example, P1 and P2). This means that the positional relation between the transfer images P1–P5 deviates on the photosensitive substrate, which would result in over exposure or under exposure in the joint portions of exposure area on the photosensitive substrate. This would cause the linewidth of pattern of device to change from a predetermined value or to be disconnected.

Now, an embodiment of the present invention is described in detail with reference to the drawings.

Figure 1:
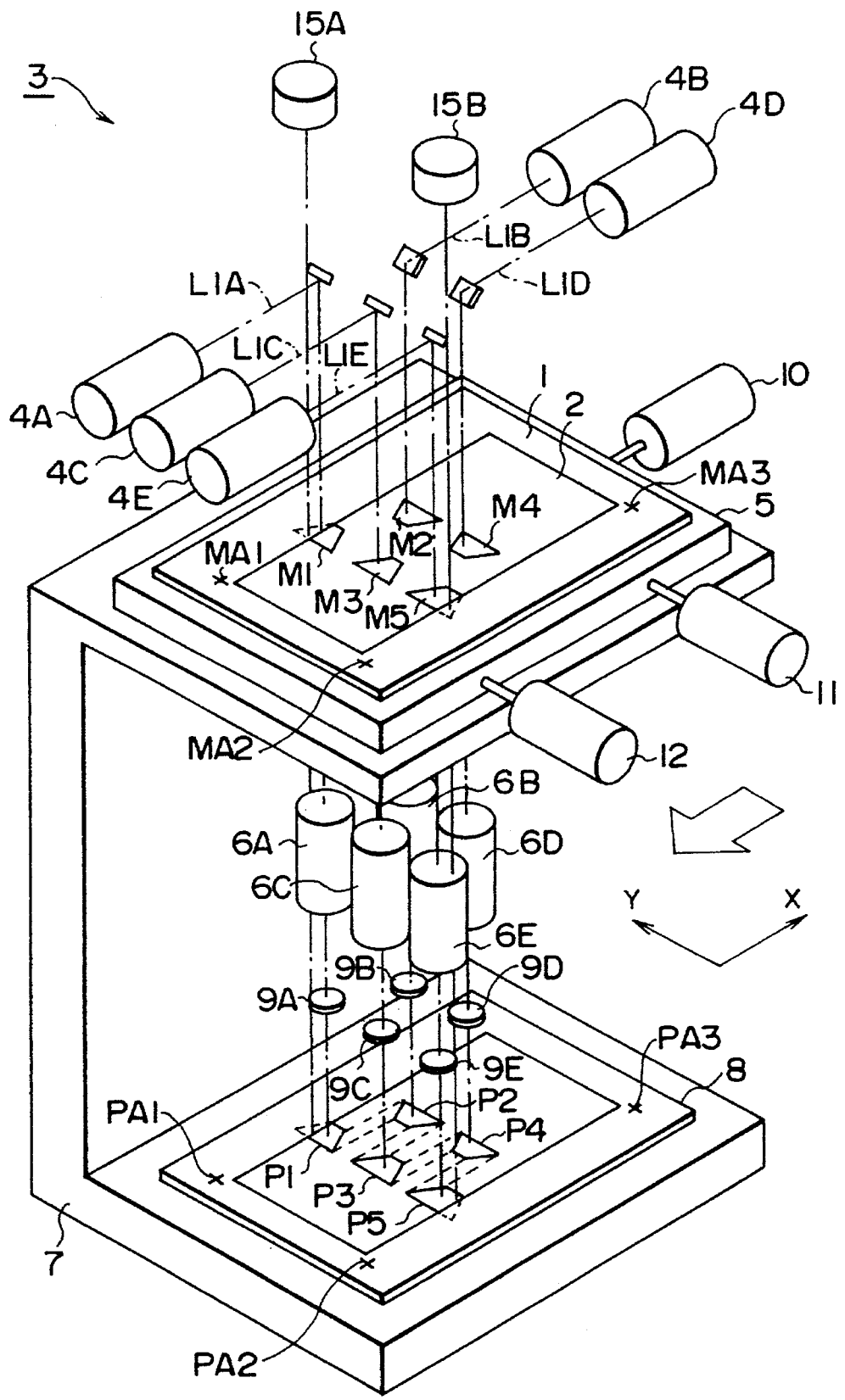
FIG. 1 is a drawing to show a scanning exposure apparatus for effecting exposure of a large-area pattern on a photosensitive substrate necessary for fabrication of liquid crystal display devices.

FIG. 1 shows a scanning exposure apparatus 3 for effecting exposure of a large-area pattern on a photosensitive substrate necessary for fabrication of liquid crystal display devices. A plurality of light beams L1A–L1E emitted from a plurality of corresponding illumination optical systems 4A–4E each illuminate a plurality of different, small regions M1–M5 on the mask 1 fixed on a mask stage 5.

The plurality of light beams L1A–L1E transmitted by the mask 1 then pass through a plurality of corresponding projection optical systems 6A–6E to illuminate the photosensitive substrate 8 mounted on a carriage 7. This causes transfer images P1–P5 corresponding to the associated, small regions M1–M5 in the mask pattern 2 to be projected onto the photosensitive substrate 8.

The each projection optical system 6A–6E is provided with a mechanism for moving the transfer image P1–P5 in the rotational direction relative to the optical axis, for example a Dove prism, and a mechanism for adjusting the magnification of transfer image P1–P5, for example a zoom lens system. Also, a mechanism 9A–9E for moving the transfer image P1–P5 in the X direction and Y direction is placed between the each projection optical system 6A–6E and the photosensitive substrate 8. Each of the mechanisms 9A–9E is composed of two glass plates supported as inclinable. These mechanisms compose an image shift/rotation/magnification adjusting mechanism (hereinafter referred to as an adjusting mechanism).

The plural transfer images P1–P5 on the photosensitive substrate 8 are shaped in trapezoid patterns as shown in FIG. 6. The upper edges of the respective trapezoid patterns are located on the side where the first transfer image series composed of the transfer images P1, P3, and P5 and the second transfer image series composed of the transfer images P2 and P4 are opposed to each other. Two adjacent transfer images, for example P1 and P2 or P2 and P3, are so arranged that the centers thereof are apart the series distance D and the image distance Ly in the X direction and in the Y direction, respectively, from each other and that triangular end portions overlap with each other in the Y direction.

In correspondence to the arrangement of the centers of the transfer images P1–P5, the optical axes of the projection optical systems 6A–6E are also apart the series distance D and the image distance Ly in the X direction and in the Y direction, respectively, from each other. The illumination optical systems 4A–4E are so arranged that the small regions M1–M5 on the mask 1 take an arrangement similar to that of the transfer images P1–P5.

The mask stage 5 is mounted on a member of carriage 7 formed in a C-shaped cross section, which is one of two opposed plate members of carriage 7 and which is perforated to have a square hole for permitting the light beams L1A–L1E to pass. The mask stage 5 is arranged to be driven by three drive motors 10–12 in the X direction, in the Y direction, and in the rotational direction about the direction of the optical axes of projection optical systems 6A–6E (or about the Z direction).

Figure 2:
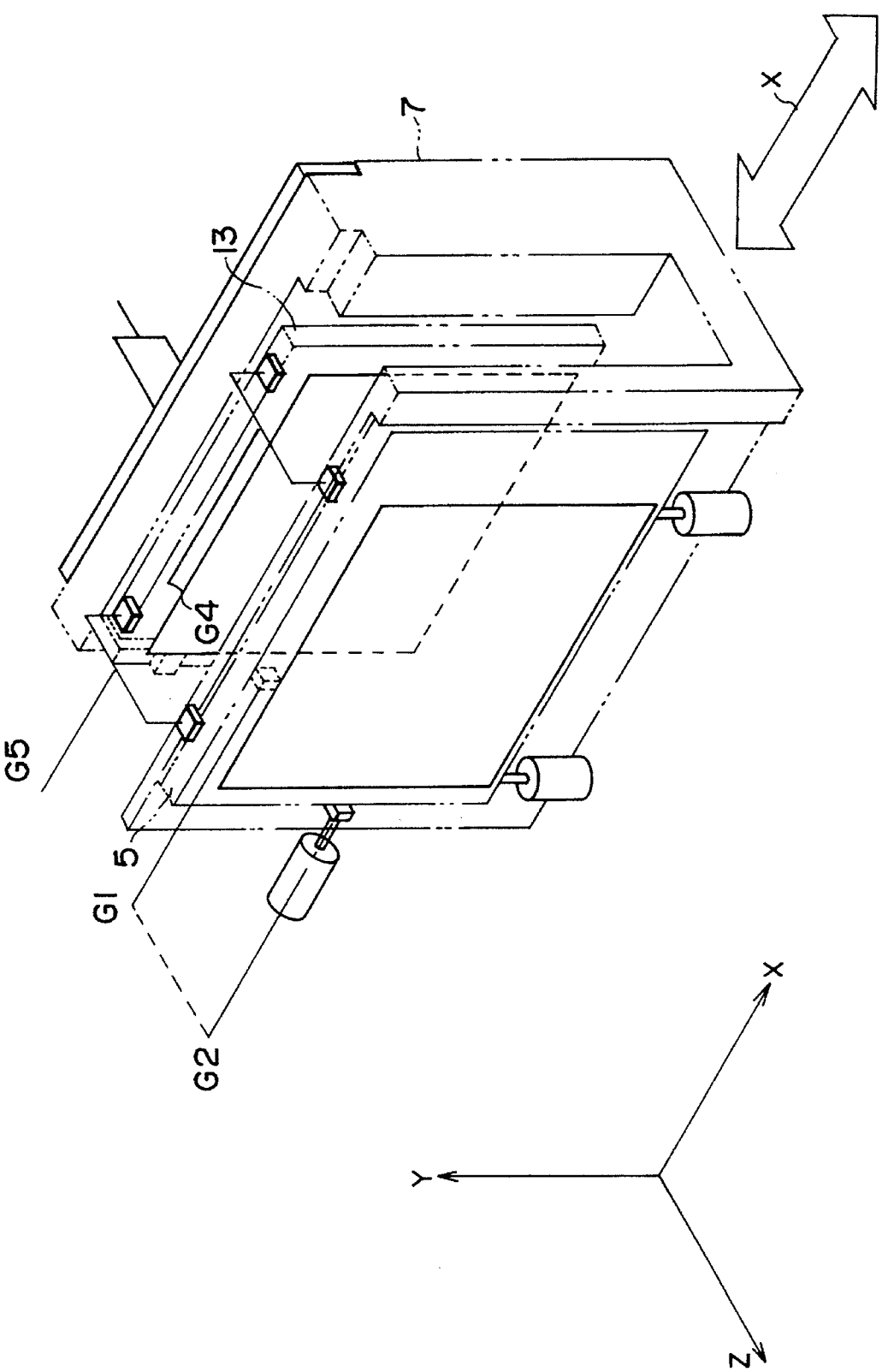
FIG. 2 is a drawing to show the arrangement of a carriage, a mask stage and interferometers.

As shown in FIG. 2, the carriage 7 and the mask stage 5 each are provided with measuring interferometers G1, G2, and positions of carriage 7 and mask stage 5 in the X direction are controlled based on outputs from the respective interferometers G1, G2. Also, a pair of measuring interferometers G4 are disposed near the X-directional ends of the substrate stage 13 with the photosensitive substrate 8 mounted thereon, and the mask stage 5. Further, another pair of measuring interferometers G5 are disposed near the other X-directional ends of the stages. This arrangement gives a Y-directional position and a rotational amount of the mask 1 relative to the photosensitive substrate 8 as calculated based on obtaining outputs $(G_4+G_5)/2$, $(G_4-G_5)/2$ from outputs $G_4$ and $G_5$ sent from a differential interferometer composed of the two pairs of measuring interferometers G4 and G5.

Figure 3:
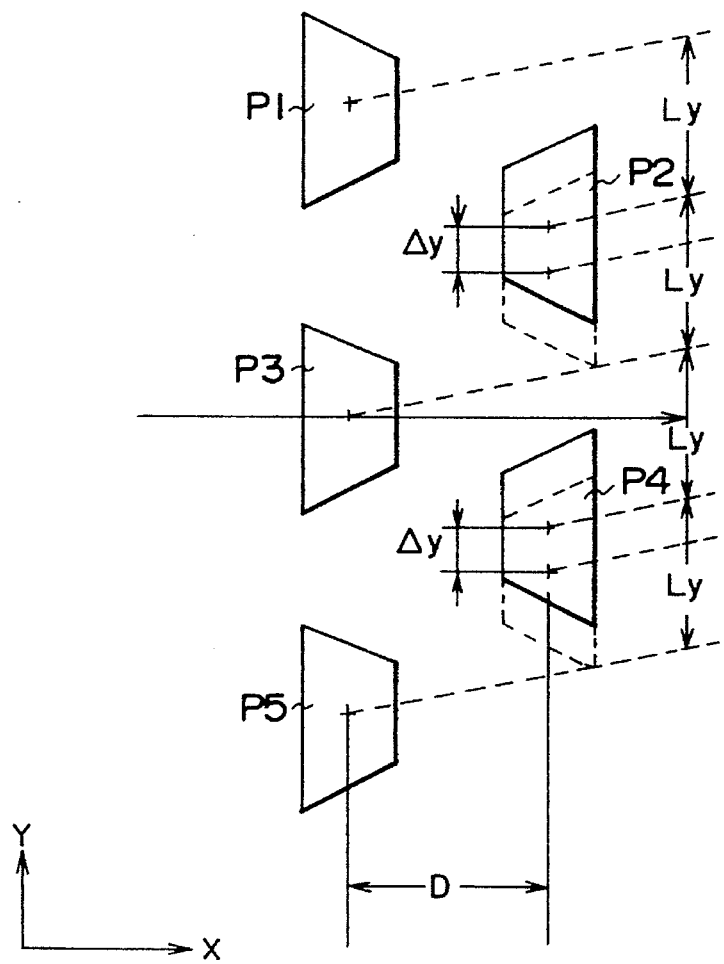
FIG. 3 is a drawing to show the positions of transfer images.

Under the above arrangement, let us suppose that the orthogonality error $\alpha$ of mask 1 as shown in FIG. 7 is preliminarily known. For correct transfer onto the photosensitive substrate 8 with correction of the orthogonality error $\alpha$, a control unit (not shown) uses the adjusting mechanisms to preliminarily shift the transfer images P2, P4 by a shift amount $\Delta y$ in the Y direction, as shown in FIG. 3. This shift amount $\Delta y$ is obtained as $\Delta y = D \cdot \tan\alpha$, using the series distance D. Further, the control unit positions the mask 1 by rotating the mask stage 5 using the drive motors 10–12 so that two edges on the scan start side and the scan end side out of the four edges of pattern 2 of mask 1 become parallel to the Y direction, as shown in FIG. 7.

Subsequently, the control unit performs scanning exposure at a constant speed in the X direction while keeping the relative positional relation in the X direction between the mask 1 and the photosensitive substrate 8 held on the carriage 7. At the same time as it, the control unit uses the drive motors 10–12 to continuously shift the mask 1 relative to the photosensitive substrate 8 in the Y direction during scanning exposure in accordance with the moving amounts of the mask 1 as shown in FIG. 8.

When the control unit controls a locus of the mask 1 in this manner, the intervals of the centers become always equal to each other between the transfer images P1 and P2, between P2 and P3, between P3 and P4, and between P4 and P5. By this, the transfer images P1–P5 can be accurately joined. Also, the orthogonality error $\alpha$ of pattern 2 shown in FIG. 7 is well corrected, whereby the mask pattern 2 can be correctly transferred onto the photosensitive substrate 8.

According to the above arrangement, by the mask stage 5 and drive motors 10–12 for relatively rotating the mask 1 to the photosensitive substrate 8 within the plane thereof and changing the relative positions of the mask 1 and photosensitive substrate 8 in the Y direction in accordance with the X-directional positions of mask 1 and photosensitive substrate 8, and the adjusting mechanisms 9A–9E for relatively changing in the Y direction the positions of transfer images P1, P2, and P5 projected through the projection optical systems 6A, 6C, and 6E to the positions of transfer images P2 and P4 projected through the projection optical systems 6B and 6D, the orthogonality error $\alpha$ of mask pattern 2 of mask 1 preliminarily known is corrected whereby the mask pattern 2 can be correctly transferred onto the photosensitive substrate 8.

The above-described embodiment showed an example in which the orthogonality error $\alpha$ owned by the mask pattern 2 of mask 1 was corrected so as to correctly transfer the mask pattern onto the photosensitive substrate 8, but the present invention is by no means limited to it; for example, the invention can be applied to cases where a mask pattern 2 has already been written on the photosensitive substrate 8 without correction of the orthogonality error $\alpha$ of mask 1 shown in FIG. 7 and a second pattern without orthogonality error is next transferred onto the photosensitive substrate 8 as superimposed on the mask pattern 2.

In this case, the control unit first measures a positional relation between marks MA1 and MA2 for alignment in the mask 1 and marks PA1 and PA2 for alignment in the photosensitive substrate 8, using two alignment sensors 15A and 15B shown in FIG. 1.

Based on the relative positional relation thus obtained between the mask 1 and the photosensitive substrate 8, the control unit obtains X-directional and Y-directional shift errors $\Delta x$ and $\Delta y$ and an rotational error. Subsequently, with the shift errors $\Delta x$ and $\Delta y$ and the rotational error, the control unit positions the mask stage 5 using the drive motors 10–12 and performs scanning exposure.

The above-described embodiment showed the example in which the orthogonality error $\alpha$ owned by the mask pattern 2 of mask 1 was corrected so as to correctly transfer the mask pattern onto the photosensitive substrate 8, but the present invention, not limited to it, can also be applied to cases where there exists a relative orthogonality $\alpha$ as shown in FIG. 7 between a mask pattern and a pattern already written in the photosensitive substrate 8. Also in this case a new pattern can be transferred onto the photosensitive substrate 8 as superimposed on the already written pattern in the same procedures as above.

Figure 4:
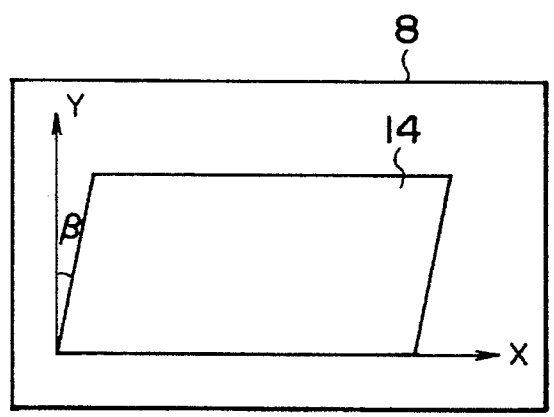
FIG. 4 is a drawing to show a case in which the edges along the Y direction of the already written pattern in the photosensitive substrate have a deviation of angle.

Further, the above-described embodiment shows the example in which the mask pattern 2 formed on the mask 1 has the orthogonality error $\alpha$ to exhibit a deviation of angle $\alpha$ in the +Y direction as the pattern goes in the +X direction, but the present invention, not limited to it, can also be applied to cases where there exists an orthogonality error $\beta$ with which the edges along the Y direction, of the already written pattern in the photosensitive substrate 8 show a deviation of angle $\beta$ in the +X direction, as shown in FIG. 4, and a new pattern is transferred onto the photosensitive substrate 8 as superimposed on the written pattern.

The control unit obtains the orthogonality error $\beta$ by measuring three or more sets of alignment marks MA1, PA1, MA2, PA2, MA3, PA3, using the above-described alignment sensors 15A and 15B.

Then the control unit uses the adjusting mechanisms to set mutual positions of the transfer images P1–P5 to be focused on the photosensitive substrate 8 through the respective projection optical systems 6A–6E. Before adjustment, the control unit sets the Y-directional positions of the centers of transfer images P1–P5 to $+2Ly$, $+Ly$, 0, $-Ly$, $-2Ly$, respectively, when the Y-directional positions of the centers of the first and second transfer image series are 0, as shown by the dashed lines in FIG. 5.

Figure 5:
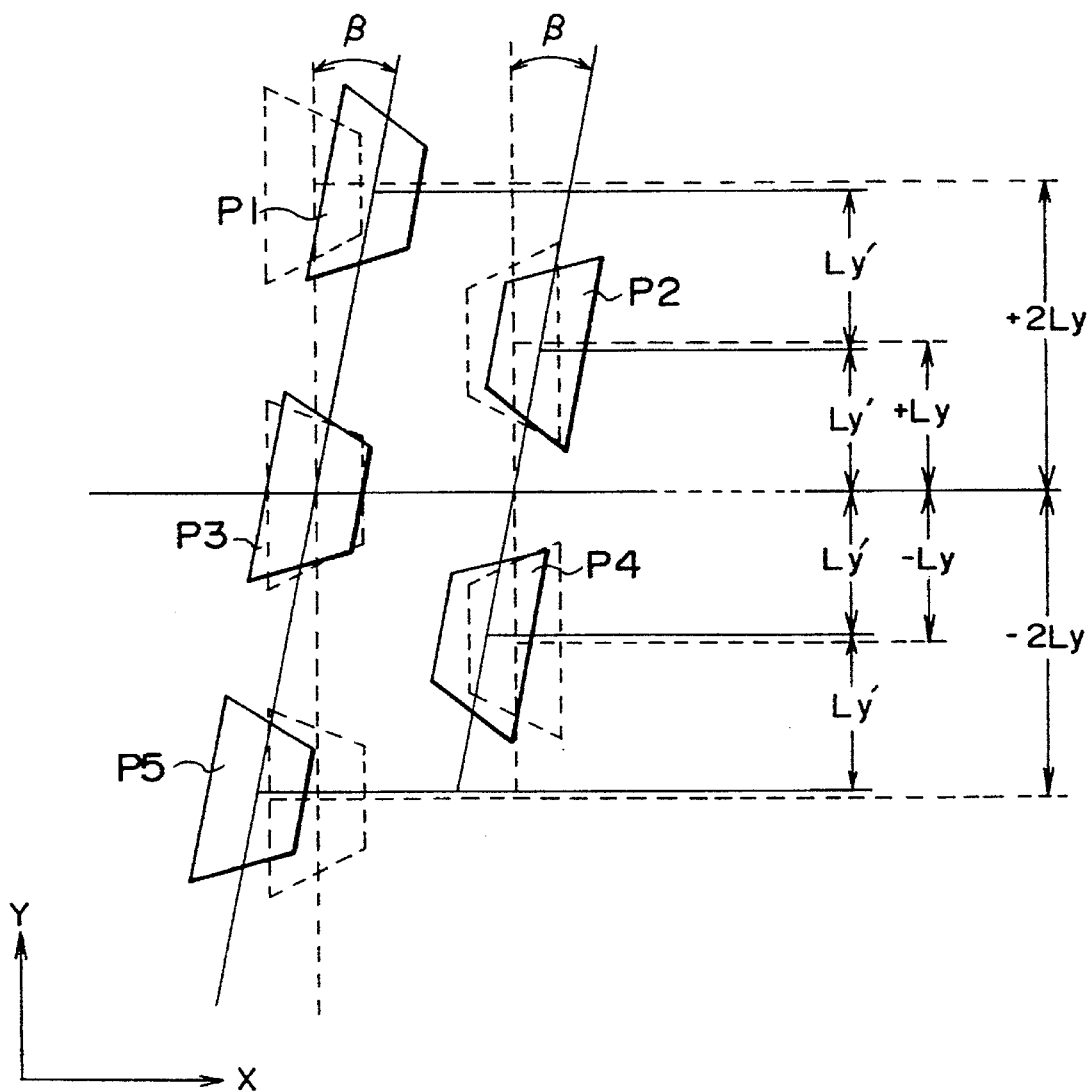
FIGS. 5 and 6 are other drawings to show the positions of transfer images.

After adjustment, the control unit sets the Y-directional positions of the centers of transfer images P1–P5 to $+2Ly\cdot\cos\beta$, $+Ly\cdot\cos\beta$, 0, $-Ly\cdot\cos\beta$, $-2Ly\cdot\cos\beta$, respectively, and sets the X-directional positions of the centers of transfer images P1–P5 to $+2Ly\cdot\sin\beta$, $+Ly\cdot\sin\beta$, 0, $-Ly\cdot\sin\beta$, $-2Ly\cdot\sin\beta$, when the X-directional positions of the centers of the first and second transfer image series are 0, as shown by the solid lines in FIG. 5.

Then the control unit uses the adjusting mechanisms for the respective projection optical systems 6A–6E to rotate the positions of transfer images P1–P5 by $\beta$. The control unit then performs scanning exposure in this state as keeping the mask 1 at a position not to cause the orthogonality error relative to the scanning direction (X direction) of carriage 7. By this, the mask pattern 2 is transferred onto the photosensitive substrate 8 as being provided with the orthogonality error $\beta$.

Incidentally, this method generates a magnification error of "$-\cos\beta$." If this becomes problematic, the adjusting mechanisms may be used to cancel the magnification error and to set the center intervals of the transfer images P1–P5 equally to the image distance Ly.

Further, the above-described embodiment showed the example in which the pattern already written in the photosensitive substrate 8 had the orthogonality error $\beta$ as shown in FIG. 4 and a new mask pattern was transferred as superimposed on this written pattern, but the present invention, not limited to it, can also be applied to cases where there exists a relative orthogonality error $\beta$ between the mask pattern and the pattern already written in the photosensitive substrate 8 and a new mask pattern is transferred as superimposed on this written pattern.

In the above-described manner, the orthogonality error of mask pattern on the mask 1 can be fully corrected by measuring the marks MA1, PA1 etc. using the detection system (alignment sensors) incorporated in the scanning exposure apparatus 3. Further, the orthogonality error $\alpha$ or $\beta$ of photosensitive substrate 8 can also be corrected by measuring positions of transfer images P1–P5 projected onto the pattern 14 formed on the photosensitive substrate 8 and obtaining correction amounts or preliminarily providing the apparatus with correction amounts. Further, inherent orthogonality errors $\alpha$ or $\beta$ of a plurality of respective photosensitive substrates 8 can also be corrected. This can improve the registration accuracy between a plurality of apparatus.

Also, the adjustment time can be decreased and the registration accuracy can be improved between the plurality of apparatus by measuring the locations of transfer images P1–P5 on the photosensitive substrate 8 as exposed using the mask pattern on the mask without orthogonality error $\alpha$, controlling the thus obtained orthogonality error as an inherent error of apparatus, and correcting it upon the scanning exposure operation by the above-described method.

Also, error components of orthogonality, scaling, (magnification) etc. can be corrected by setting three or more sets of alignment marks MA1, MA2, PA1, PA2, etc. and calculating the error components by the method of least squares or the like using the measurement results.

Further, the above-described embodiment showed the cases for processing one photosensitive substrate 8, but the present invention, not limited to it, can also be applied to cases for continuously and equally processing a plurality of photosensitive substrates 8. In that case, instead of calculating the orthogonality error $\alpha$ of photomask pattern 2 or the orthogonality error $\beta$ of pattern 14 every photosensitive substrate 8 in the above procedures, the orthogonality error $\alpha$ or $\beta$ may be obtained using first several photosensitive substrates 8, and subsequent photosensitive substrates 8 may be processed using the thus obtained orthogonality error based on the measurement. This can decrease the working time.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application No. 158126/1994 filed on Jun. 16, 1994 is hereby incorporated by reference.

What is claimed is:

1. A scanning exposure apparatus for transferring a pattern on a mask onto a photosensitive substrate, comprising:

a plurality of illumination optical systems for illuminating a plurality of regions on said mask, respectively;

a first optical system having a plurality of projection optical systems optical axes of which are arranged in parallel with one another, perpendicular to a first direction, and in a plane which is parallel with said first direction;

a second optical system having a plurality of projection optical systems optical axes of which are arranged in parallel with the optical axes of the projection optical systems of said first optical system and are arranged in a line a predetermined distance apart from the line along which optical axes of the projection optical systems of said first optical system are arranged, some of images of the plurality of regions on said mask and the rest of the images being simultaneously projected through said first optical system and said second optical system, respectively, onto said substrate;

a scanning mechanism for moving said mask and said substrate synchronously in a direction approximately perpendicular to said first direction and in the plane of said substrate, thereby said mask and said substrate being scanned;

a rotating mechanism for effecting relative rotation between said mask and said substrate in the plane of one of said mask and said substrate;

a position changing mechanism for changing relative positions of said mask and said substrate in said first direction in accordance with a position in a direction of the scanning of one of said mask and said substrate; and an image position changing mechanism for relatively changing positions of the images projected through said first optical system and positions of the images projected through said second optical system in said first direction.

2. A scanning exposure apparatus according to claim 1, wherein the relative change by said image position changing mechanism is performed based on a deviation of angle of a first coordinate system concerning an arrangement of the pattern formed on said mask with respect to a second coordinate system determined by the scanning direction and a direction perpendicular to said scanning direction.

3. A scanning exposure apparatus according to claim 1, wherein first images of the pattern on said mask are preliminarily formed on said substrate, and second images of the pattern on said mask are then to be projected for exposure as overlapping with said first images, and wherein the relative change of the positions of said second images by said image position changing mechanism is performed based on a deviation of angle of a first coordinate system concerning an arrangement of said first images with respect to a second coordinate system determined by the scanning direction and a direction perpendicular to said scanning direction.

4. A scanning exposure apparatus according to claim 1, wherein first images of the pattern on said mask are preliminarily formed on said substrate, and second images of the pattern on said mask are then to be projected for exposure as overlapping with said first images, and wherein the relative change of the positions of said second images by said image position changing mechanism is performed based on a deviation of angle of a first coordinate system concerning an arrangement of the pattern on said mask with respect to a second coordinate system concerning an arrangement of said first images.

5. A scanning exposure apparatus for transferring a pattern on a mask onto a photosensitive substrate, comprising:

a plurality of illumination optical systems for illuminating a plurality of regions on said mask, respectively;

a first optical system having a plurality of projection optical systems optical axes of which are arranged in parallel with one another, perpendicular to a first direction, and in a plane which is parallel with said first direction;

a second optical system having a plurality of projection optical systems optical axes of which are arranged in parallel with the optical axes of the projection optical systems of said first optical system and are arranged in a line a predetermined distance apart from the line along which optical axes of the projection optical systems of the first optical system are arranged, some of images of the plurality of regions on said mask and the rest of the images being projected through said first optical system and said second optical system, respectively, onto said substrate;

a scanning mechanism for moving said mask and said substrate synchronously in a direction approximately perpendicular to said first direction and in the plane of said substrate, thereby said mask and said substrate being scanned; and an image position changing mechanism for changing, by a predetermined angle, arrangement directions of the images projected through said first optical system and said second optical system relative to said first direction, changing an interval between the images projected through said first optical system and an interval between the images projected through said second optical system, and changing positions of the respective images in a rotational direction with respect to the optical axes of the projection optical systems of said first optical system and said second optical system.

6. A scanning exposure apparatus according to claim 5, wherein first images of the pattern on said mask are preliminarily formed on said substrate, and second images of the pattern on said mask are then to be projected for exposure as overlapping with said first images, and wherein said image position changing mechanism performs the changing of arrangement directions, the changing of image intervals, and the changing of positions in the rotational direction, based on a deviation of angle of a first coordinate system concerning an arrangement of said first images with respect to a second coordinate system determined by a direction of the scanning and a direction perpendicular to said scanning direction.

7. A scanning exposure apparatus according to claim 5, wherein first images of the pattern on said mask are preliminarily formed on said substrate, and second images of the pattern on said mask are then to be projected for exposure as overlapping with said first images, and wherein said image position changing mechanism performs the changing of arrangement directions, the changing of image intervals, and the changing of positions in the rotational direction, based on a deviation of angle of a first coordinate system concerning an arrangement of the pattern on said mask with respect to a second coordinate system concerning an arrangement of said first images.

8. An exposure method carried out by a scanning exposure apparatus comprising a plurality of illumination optical systems for illuminating a plurality of regions on a mask with a pattern formed thereon, respectively; a first optical system having a plurality of projection optical systems optical axes of which are arranged in parallel with one another, perpendicular to a first direction, and in a plane which is parallel with said first direction; a second optical system having a plurality of projection optical systems optical axes of which are arranged in parallel with the optical axes of the projection optical systems of said first optical system and are arranged in a line a predetermined distance apart from the line along which optical axes of the projection optical systems of said first optical system are arranged, some of images of the plurality of regions on said mask and the rest of the images being projected through said first optical system and said second optical system, respectively, onto said substrate; and a scanning mechanism for moving said mask and said substrate synchronously in a direction approximately perpendicular to said first direction and in the plane of said substrate, thereby said mask and said substrate being scanned, comprising:

a rotating process for relatively rotating said mask and said substrate within the plane of one of said mask and said substrate;

a position changing process for changing relative positions of said mask and said substrate in said first direction in accordance with a position of one of said mask and said substrate in a direction of the scanning; and an image position changing process for relatively changing positions of the images projected through said first optical system and positions of the images projected through said second optical system in said first direction.

9. An exposure method according to claim 8, wherein said image position changing process is arranged to effect the relative change, based on a deviation of angle of a first coordinate system concerning an arrangement of the pattern formed on said mask with respect to a second coordinate system determined by a direction of the scanning and a direction perpendicular to the scanning direction.

10. An exposure method according to claim 8, wherein first images of the pattern on said mask are preliminarily formed on said substrate, and second images of the pattern on said mask are then to be projected for exposure as overlapping with said first images, and wherein said image position changing process is to effect the relative change, based on a deviation of angle of a first coordinate system concerning an arrangement of said first images with respect to a second coordinate system determined by a direction of the scanning and a direction perpendicular to the scanning direction.

11. An exposure method according to claim 8, wherein first images of the pattern on said mask are preliminarily formed on said substrate, and second images of the pattern on said mask are then to be projected for exposure as overlapping with said first images, and wherein said image position changing process is to effect the relative change, based on a deviation of angle of a first coordinate system concerning an arrangement of the pattern on said mask with respect to a second coordinate system concerning an arrangement of said first images.

12. An exposure method carried out by a scanning exposure apparatus comprising a plurality of illumination optical systems for illuminating a plurality of regions on a mask with a pattern formed thereon, respectively; a first optical system having a plurality of projection optical systems optical axes of which are arranged in parallel with one another, perpendicular to a first direction, and in a plane which is parallel with said first direction; a second optical system having a plurality of projection optical systems optical axes of which are arranged in parallel with the optical axes of the projection optical systems of said first optical system and are arranged in a line a predetermined distance apart from the line along which optical axes of the projection optical systems of said first optical system are arranged, some of images of the plurality of regions on said mask and the rest of the images being projected through said first optical system and said second optical system, respectively, onto said substrate; and a scanning mechanism for moving said mask and said substrate synchronously in a direction approximately perpendicular to said first direction and in the plane of said substrate, thereby said mask and said substrate being scanned, said exposure method comprising an image position changing process for changing, by a predetermined angle, arrangement directions of the images projected through said first optical system and said second optical system relative to said first direction, changing an interval between the images projected through said first optical system and an interval between the images projected through said second optical system, and changing positions of the respective images in a rotational direction with respect to the optical axes of the projection optical systems of said first optical system and said second optical system.

13. An exposure method according to claim 12, wherein first images of the pattern on said mask are preliminarily formed on said substrate, and second images of the pattern on said mask are then to be projected for exposure as overlapping with said first images, and wherein said image position changing process is to effect the changing of arrangement directions, the changing of image intervals, and the changing of positions in the rotational direction, based on a deviation of angle of a first coordinate system concerning an arrangement of said first images with respect to a second coordinate system determined by a direction of the scanning and a direction perpendicular to the scanning direction.

14. An exposure method according to claim 12, wherein first images of the pattern on said mask are preliminarily formed on said substrate, and second images of the pattern on said mask are then to be projected for exposure as overlapping with said first images, and wherein said image position changing process is to effect the changing of arrangement directions, the changing of image intervals, and the changing of positions in the rotational direction, based on a deviation of angle of a first coordinate system concerning an arrangement of the pattern on said mask with respect to a second coordinate system concerning an arrangement of said first images.

* * * * *